US007733929B2

(12) United States Patent
Sasada et al.

(10) Patent No.: US 7,733,929 B2
(45) Date of Patent: Jun. 8, 2010

(54) WAVELENGTH TUNABLE OPTICAL TRANSMITTER AND OPTICAL TRANSCEIVER

(75) Inventors: Noriko Sasada, Yokohama (JP);
Kazuhiko Naoe, Yokohama (JP);
Kazuhise Uomi, Hachioji (JP);
Masanobu Okayasu, Yokohama (JP)

(73) Assignee: Opnext Japan, Inc., Yokohama-shi (JP)

( * ) Notice: Subject to any disclaimer, the term of this patent is extended or adjusted under 35 U.S.C. 154(b) by 0 days.

(21) Appl. No.: 11/452,312

(22) Filed: Jun. 14, 2006

(65) Prior Publication Data
US 2007/0081565 A1    Apr. 12, 2007

(30) Foreign Application Priority Data
Oct. 12, 2005   (JP)   ............................. 2005-297287

(51) Int. Cl.
*H01S 3/10* (2006.01)
*H01S 3/13* (2006.01)
*H01S 3/04* (2006.01)

(52) U.S. Cl. ................. 372/29.02; 372/20; 372/29.021; 372/30; 372/31; 372/34

(58) Field of Classification Search ........................ None
See application file for complete search history.

(56) References Cited

U.S. PATENT DOCUMENTS 5,173,909 A * 12/1992 Sakano et al. ................. 372/20
6,516,017 B1   2/2003 Matsumoto
7,372,879 B2 * 5/2008 Giaretta et al. ........... 372/29.02
2003/0095736 A1   5/2003 Kish, Jr. et al.

FOREIGN PATENT DOCUMENTS

| EP | 0 813 272 A2 | 12/1997 |
|---|---|---|
| JP | 2001-144367 | 5/2001 |
| JP | 2005-045548 | 2/2005 |
| WO | WO 03/023915 A2 | 3/2003 |

OTHER PUBLICATIONS

Wide Temperature Range (0 to 85° C.), 40-km SMF Transmission of a 1.55-μm, 10-Gbit/s InGaAlAs Electroabsorption Modulator Integrated DFB Laser, Shigeki Makino, et al., © 2005 Optical Society of America, 3 pages.
European Search Report issued in corresponding European Patent Application No. 06012308.0, dated Jan. 16, 2008.

* cited by examiner

*Primary Examiner*—Minsun Harvey
*Assistant Examiner*—Sean Hagan
(74) *Attorney, Agent, or Firm*—Antonelli, Terry, Stout & Kraus, LLP.

(57) ABSTRACT

A wavelength tunable laser module for DWDM is used, in which a single electroabsorption modulator integrated laser is mounted and an oscillation wavelength is made tunable by temperature control. Driving conditions of a laser and a modulator are determined such that they have approximately the same modulation and transmission characteristics in a temperature control range. Such an electroabsorption modulator integrated laser is used and the driving conditions are incorporated, thereby a small, inexpensive wavelength tunable optical transmitter can be provided.

12 Claims, 9 Drawing Sheets

| T (°C) | Iop (mA) | Tb (V) | Vpp (V) | λ (nm) | ITU-T STANDARD WAVELENGTH CHANNEL | ACER (dB) | Pp (dB) |
|---|---|---|---|---|---|---|---|
| 15.2 | 52 | -1.55 | 2.15 | 1551.72 | 32 | 9.2 | 0.5 |
| 25.4 | 72 | -1.30 | 1.90 | 1552.52 | 31 | 9.3 | 0.4 |
| 54.9 | 103 | -0.65 | 1.70 | 1555.75 | 27 | 9.6 | 0.6 |

| 201 | 202 | 203 | 204 | 205 | 206 | 207 | 208 |
|---|---|---|---|---|---|---|---|
| T (°C) | Iop (mA) | Tb (V) | Vpp (V) | λ (nm) | ITU-T STANDARD WAVELENGTH CHANNEL | ACER (dB) | Pp (dB) |
| -4.8 | 56 | -1.95 | 2.30 | 1546.12 | 39 | 9.6 | 0.6 |
| 50.6 | 97 | -0.80 | 2.05 | 1551.72 | 32 | 9.9 | 0.7 |
| 84.8 | 134 | -0.25 | 1.85 | 1554.94 | 28 | 10.3 | 0.7 |

FIG. 16

WAVELENGTH TUNABLE OPTICAL TRANSMITTER AND OPTICAL TRANSCEIVER

CLAIM OF PRIORITY

The present application claims priority from Japanese patent application serial no. 2005-297287, filed on Oct. 12, 2005, the content of which is hereby incorporated by reference into this application.

BACKGROUND OF THE INVENTION

The present invention relates to a wavelength tunable optical transmitter and an optical transceiver, and particularly relates to a wavelength tunable optical transmitter and an optical transceiver which operate stably over wide wavelength channels.

Currently, dense wavelength division multiplexing (DWDM) optical transmission for transmitting optical signals in multiple wavelengths by a single optical fiber, which is often used in a backbone system, is an important transmission system that can realize long distance and large capacity optical transmission. For the DWDM optical transmission, the ITU-T standard defines grid wavelengths (wavelength channels) in a 1.55 μm wavelength band for realizing the long-distance optical transmission, of which the wavelength interval (frequency interval) is 0.4 nm (50 GHz) or 0.8 nm (100 GHz).

A wavelength tunable optical transmitter has been developed, which can cover wavelengths of multiple channels by a single optical transmitter. In the wavelength tunable optical transmitter, it is necessary that only an oscillation wavelength is changed in a wavelength interval for DWDM, and other characteristics (optical output power, a modulation characteristic, a transmission characteristic and the like) are kept constant irrespective of a wavelength.

Currently, there are roughly two types of laser modules used for the wavelength tunable optical transmitter for DWDM. One is in a method of using multiple laser arrays, and the other is in a method of changing the temperature of a laser.

The former is an LD array in which multiple distributed feedback laser diodes (DFB-LD) or distributed Bragg reflector laser diodes (DBR-LD), of which the pitches of diffraction gratings are varied such that they oscillate at different oscillation wavelengths from each together in a wavelength interval for DWDM, are integrated in an array form on a semiconductor photonic device. In this configuration, generally, a multi-mode interference (MMI) multiplexer and a semiconductor optical amplifier (SOA) are also integrated in the same device. The MMI multiplexer is to multiplex oscillation light from each of the laser diodes of the LD array, and SOA is to compensate loss of light power in the MMI. When the LD array is used, since the oscillation wavelength can be varied to the number of LDs in the LD array even if the temperature of the semiconductor photonic device is kept constant, many channels can be covered.

An external modulator such as an EA modulator can be integrated in the front of SOA in order to modulate oscillation light having multiple wavelengths from the LD array. However, an integrated external modulator can be operated only within a wavelength range in which the modulation characteristic or the transmission characteristic can be kept constant. Therefore, typically, a lithium niobate (LN: LiNbO$_3$) modulator module, which has small wavelength dependence with respect to the modulation and transmission characteristics, is often provided outside a wavelength tunable laser module.

JP-A No. 2001-144367 describes that a semiconductor laser system in a configuration of a combination of the LD array, a coupler (multiplexer), a single semiconductor optical amplifier, and a single EA modulator is driven by changing offset bias of the EA modulator. As a U.S. counterpart to JP-A No. 2001-144367, U.S. Pat. No. 6,516,017 is given.

The latter is a single DFB-LD integrated with a single EA modulator (EA/DFB: Electroabsorption Modulator Integrated DFB Laser). In this case, the temperature of the EA/DFB device is changed so that the oscillation wavelength is changed to be adapted to the wavelength channel for DWDM.

JP-A No. 2005-045548 describes an optical transmitter in which a semiconductor laser and an electroabsorption modulator are separately subjected to temperature control. In the optical module, the temperature of the semiconductor laser is changed to vary a wavelength, and information on the wavelength is fed back to temperature control of the modulator, thereby a constant characteristic can be obtained without changing driving bias of the modulator.

S. Makino et al., "Wide Temperature Range (0 to 85° C.), 40-km SMF Transmission of a 1.55-μm, 10 Gbits/s InGaAs Electroabsorption Modulator Integrated DFB laser", OFC2005, PDP14 describes an indium-gallium-aluminum-arsenic (InGaAlAs) base EA/DFB laser which can be used without cooling in a range of 0° C. to 85° C. In addition, the above literature describes that the oscillation wavelength is 1550 nm at 0° C. but about 1560 nm at 85° C.

The semiconductor laser system of JP-A No. 2001-144367 is difficult to be reduced in overall module size. Moreover, since there are many types of functional elements integrated on one device, significant yield reduction may anxiously occur in fabricating the device.

In the optical transmitter of JP-A No. 2005-045548, the semiconductor laser and the electroabsorption modulator are provided as separate elements, and coupling loss necessarily occurs between them. Moreover, since the semiconductor laser and the electroabsorption modulator are separately subjected to temperature control, reductions in size and power consumption are difficult.

Embodiments of the invention use a single EA modulator/laser. In this case, the EA modulator/laser may be used in a wide temperature range, consequently it is necessary to adjust drive conditions of a laser device and an EA modulator device.

SUMMARY OF THE INVENTION

According to the embodiments of the invention, a wavelength tunable optical transmitter that is small in size, high in yield, and inexpensive can be provided, of which the characteristics as the EA modulator integrated laser are not changed even if driving conditions are changed.

The above optical transmitter can be achieved by a wavelength tunable optical transmitter including an electroabsorption modulator integrated laser having an electroabsorption modulator and a semiconductor laser integrated on a substrate, a temperature control section for controlling a temperature of the electroabsorption modulator integrated laser, a laser drive section for driving the semiconductor laser, and a modulator drive section for driving the electroabsorption modulator, wherein the temperature control section changes the temperature of the electroabsorption modulator integrated laser so that an oscillation wavelength of the semiconductor laser is made tunable within a wavelength range of 3 nm or more, and the laser drive section and the modulator drive section drive the semiconductor laser and the electroabsorption modulator respectively such that the electroabsorption modulator integrated laser has approximately the same modulation and transmission characteristics in the wavelength range.

Moreover, the above optical transmitter can be achieved by a wavelength tunable optical transmitter including an electroabsorption modulator integrated laser having an electroabsorption modulator and a semiconductor laser integrated on a substrate, a temperature control section for controlling a temperature of the electroabsorption modulator integrated laser, a laser drive section for driving the semiconductor laser, and a modulator drive section for driving the electroabsorption modulator, wherein the laser drive section changes a current applied to the semiconductor laser depending on temperature within a temperature range of difference in temperature of 30° C. or more provided by the temperature control section, and the modulator drive section changes amplitude voltage of a high frequency signal applied to the electroabsorption modulator and reverse voltage applied to the electroabsorption modulator depending on temperature within the temperature range.

BRIEF DESCRIPTION OF THE DRAWINGS

Preferred embodiments of the present invention will now be described in conjunction with the accompanying drawings, in which.

DESCRIPTION OF THE PREFERRED EMBODIMENT

Hereinafter, embodiments of the invention will be described in detail with reference to drawings using examples.

Example 1

Figure 1:
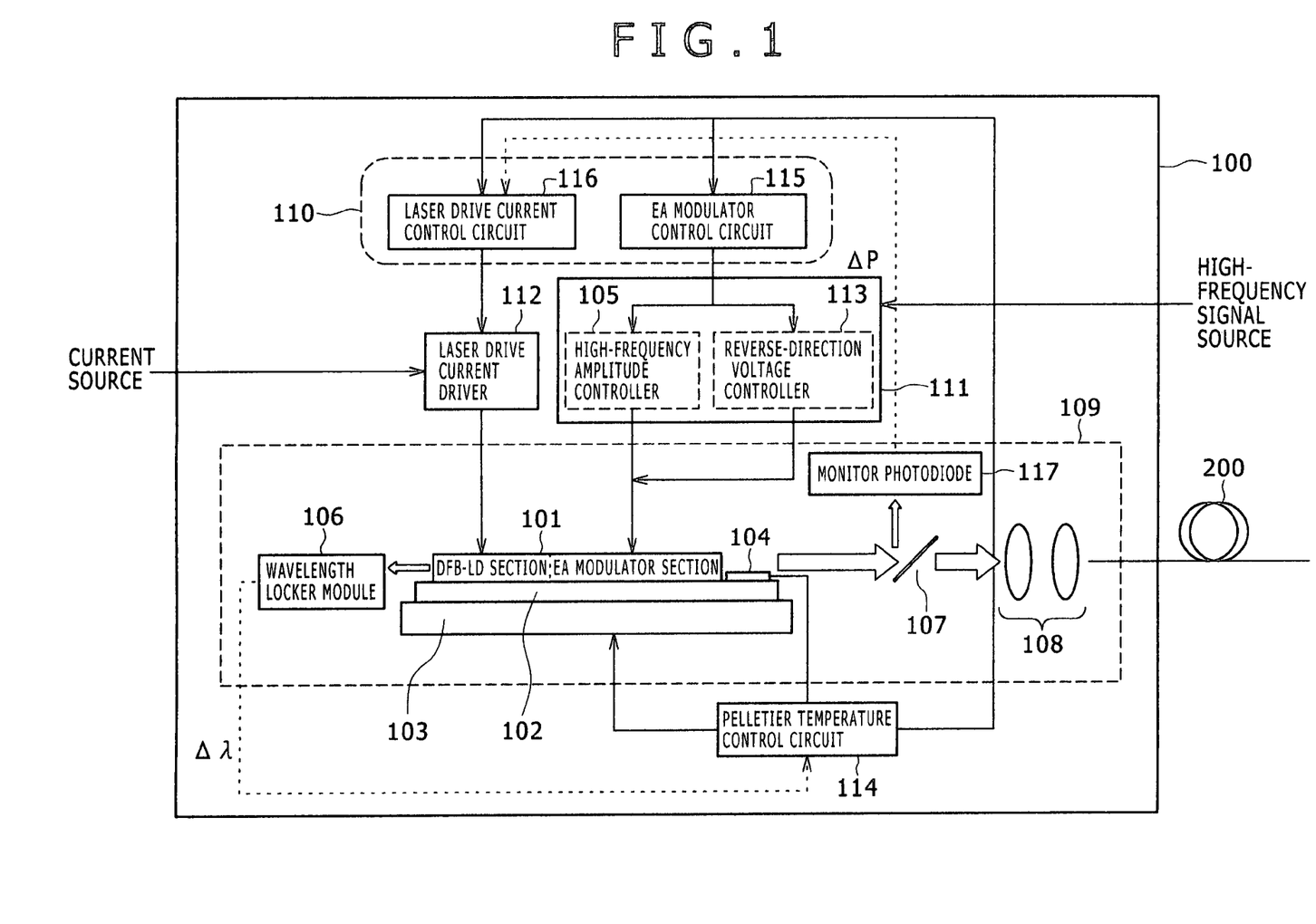
FIG. 1 is a block diagram of an optical transmitter in which an EA/DFB device is mounted on a wavelength tunable module.

FIG. 1 is a block diagram of an optical transmitter in which an EA/DFB device is mounted on a wavelength tunable module. Here, an EA/DFB device 101 includes a DFD-LD section and an EA modulator section integrated therein. The EA/DFB device 101 is mounted on a Pelletier substrate 103 for temperature control via a chip carrier 102. A thermistor 104 is mounted on the chip carrier 102 as closely to the EA/DFB device 101 as possible, and the thermistor 104 monitors the temperature of the EA/DFB device via the chip carrier 102. Front output light of the EA/DFB device 101 is partially branched for a monitor photodiode (monitor PD) 117 by a beam splitter 107. The front output light that has passed through the beam splitter 107 is coupled with an optical fiber 200 by a lens system 108. On the other hand, rear output light of the EA/DFB device 101 is inputted into a wavelength locker module 106. Here, the wavelength locker module 106 is an optical component including an etalon and two photodiodes, and a photocurrent ratio between the two photodiodes is kept constant before and after passing through the etalon, thereby a wavelength is locked to realize high wavelength stability. Conversely, the oscillation wavelength can be monitored from the photocurrent ratio between the two photodiodes.

An optical transmitter 100 shown in FIG. 1 includes a Pelletier temperature control circuit 114, an EA modulator driver 111, a laser drive current driver 112, and a drive control circuit 110 in addition to optical components configuring the wavelength tunable laser module 109. The Pelletier temperature control circuit 114 usually controls the Pelletier substrate 103 such that a resistance value of the thermistor 104 is kept constant. However, when the photocurrent ratio between the two photodiodes of the wavelength locker module 106 is shifted from a setting value, the circuit 114 preferentially controls the photocurrent ratio to be constant. This is to compensate for aged deterioration of the DFB-LD. Moreover, the Pelletier temperature control circuit 114 can change a value of the photocurrent ratio that is controlled to be constant by a not-shown control line. Such operation is used to change the oscillation wavelength of the DFB-LD.

The drive control circuit 110 includes an EA modulator control circuit 115 and a laser drive current control circuit 116. The EA modulator control circuit 115 sets a driving condition of the EA modulator in the EA modulator driver 111 based on a device temperature obtained from the Pelletier temperature control circuit 114. On the other hand, the laser drive current control circuit 116 sets a driving condition of the DFB-LD in the laser drive current driver 112 based on the device temperature obtained from the Pelletier temperature control circuit 114 and intensity of the front output light detected by the monitor photodiode 117.

The EA modulator driver 111 includes a high-frequency amplitude controller 105 and a reverse-direction voltage controller 113. The EA modulator driver 111 adjusts a high-frequency signal using high frequency amplitude and reverse-direction voltage set by the EA modulator control circuit 115, and then inputs the signal into the EA modulator section of the EA/DFB device 101.

The laser drive current driver 112 inputs drive current set by the laser drive current control circuit 116 into the DFB-LD section of the EA/DFB device 101.

To keep the front optical output constant, the driver 112 performs APC (Auto Power Control) control of feeding back small variation ΔP of light power received by the monitor PD to a laser drive current source. On the other hand, the temperature control section 114 on the Pelletier substrate 103 determines the device temperature and keeps it constant while monitoring the resistance value of the thermistor 104. When the device temperature is slightly varied, since the oscillation wavelength monitored by a wavelength monitor mechanism is slightly varied, the control section 114 senses such variation and performs ATC (Auto Temperature Control) control of feeding back the variation to the Pelletier control section on the Pelletier substrate 103.

Generally, the oscillation wavelength λ of the DFB-LD has temperature dependence of about 0.1 nm/° C. because effective refractivity of the LD section is varied with variation in the device temperature. The device temperature is intentionally changed by using this, thereby the wavelength can be made tunable to be adapted to the wavelength channel for DWDM. For example, when the device temperature is changed 90° C. from T1=−5° C. to T4=85° C., the wavelength can be varied about 9 nm (corresponding to 22 channels in the case of an interval of 0.4 nm, and 11 channels in the case of an interval of 0.8 nm). On the other hand, the device temperature, or the oscillation wavelength is varied, information of the Pelletier temperature control section 114 is sent to the control circuit section 110 that determines driving conditions of the device. Driving conditions of the LD and the modulator are changed depending on the device temperature, thereby approximately the same modulation characteristic and the transmission characteristic can be obtained over large number of wavelength channels. Hereinafter, a driving method of the wavelength tunable optical transmitter is described.

Figure 2:
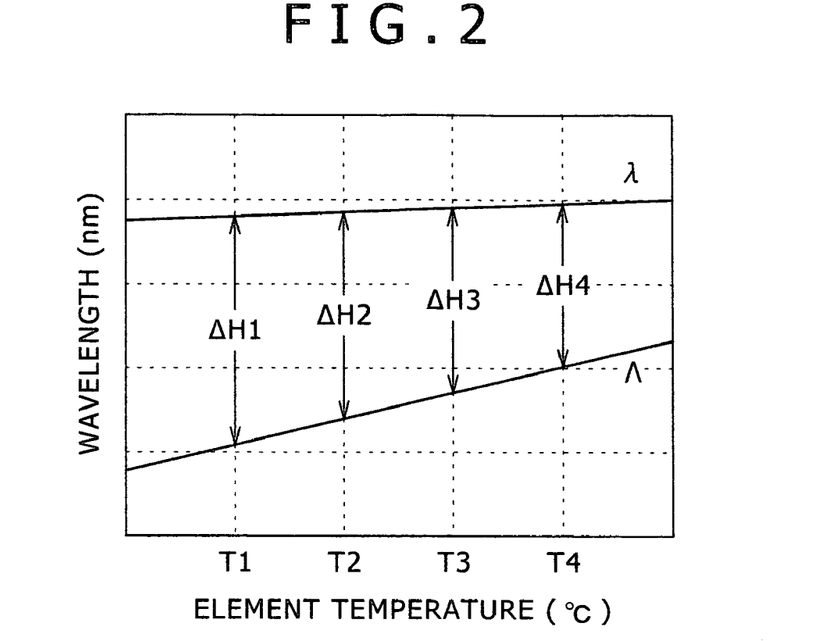
FIG. 2 is a view for illustrating temperature dependence of an oscillation wavelength of DFB-LD and an absorption edge wavelength of an EA modulator.

FIG. 2 is a view for illustrating temperature dependence of the oscillation wavelength of the DFB-LD and an absorption edge wavelength of the EA modulator. As described above, the oscillation wavelength λ (lambda) of the DFB-LD has the temperature dependence of about 0.1 nm/° C. On the other hand, the absorption edge wavelength Λ (large lambda) of the EA modulator has temperature dependence of about 0.6 nm/° C. The detuning level ΔH (=λ−Λ) is an important parameter for determining the characteristic of the EA/DFB device, and has temperature dependence of about −0.5 nm/° C.

Figure 3:
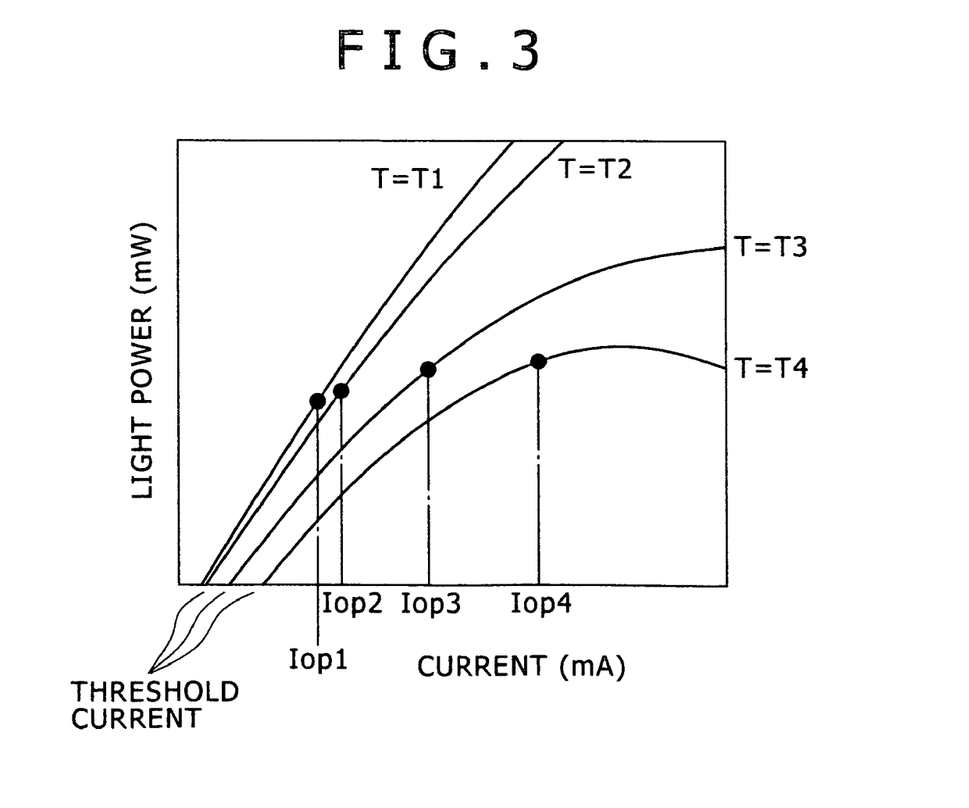
FIG. 3 is a view for illustrating device-temperature dependence of a current-optical output (I-L) characteristic of a DFB-LD section.

FIG. 3 is a view for illustrating device-temperature dependence of a current-optical output (I-L) characteristic of the DFB-LD section. FIG. 3 shows a result of measuring the current-optical output (I-L) characteristic with temperature as a parameter on a single DFB-LD formed by cutting the EA modulator section using cleavage. Here, T1<T2<T3<T4 is given. It is known from FIG. 3 that as the device temperature is increased, threshold current (x-intercept of a curve) at which laser oscillation is started is increased, and light power is decreased.

Figure 4:
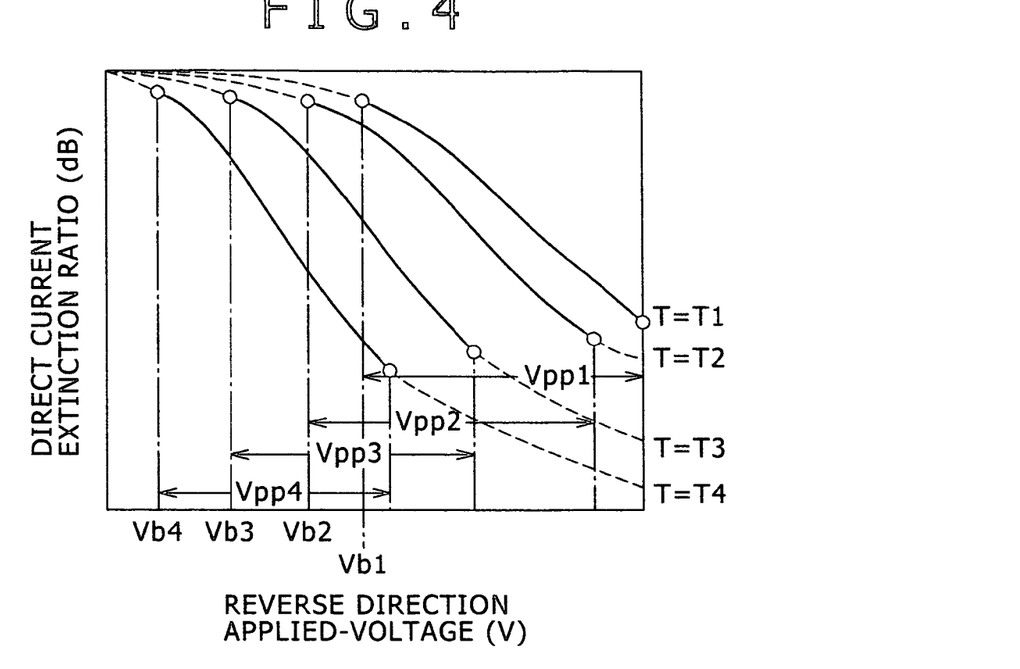
FIG. 4 is a view for illustrating device-temperature dependence of a characteristic of a direct current extinction ratio (DCER)
Figure 5:
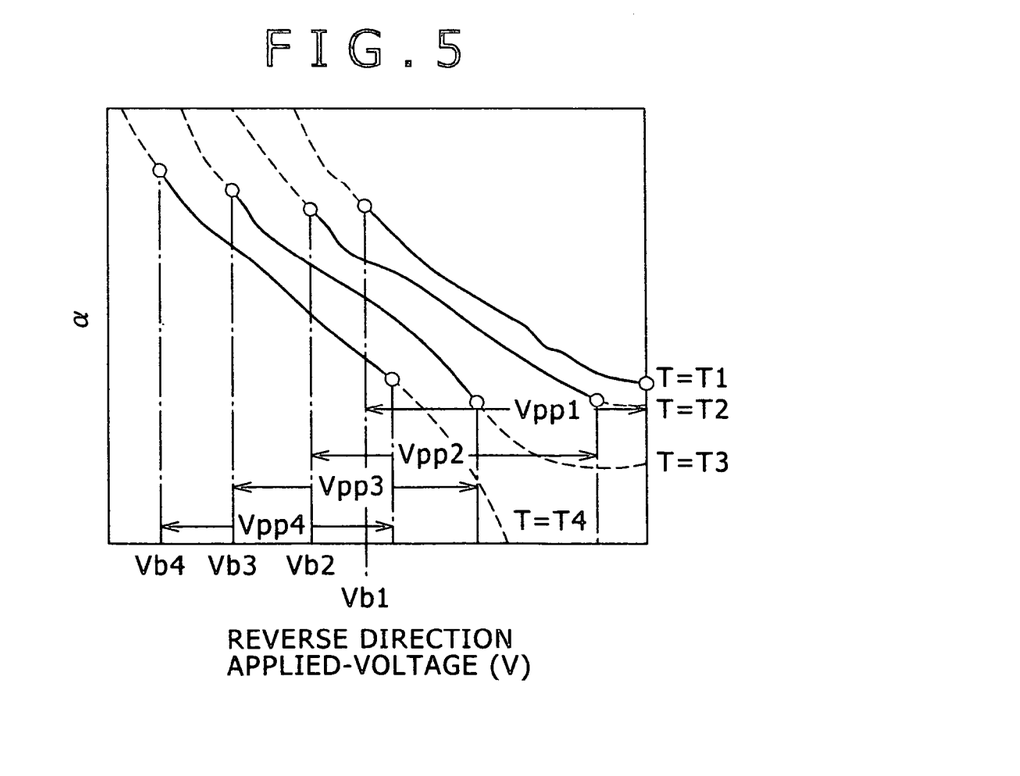
FIG. 5 is a view for illustrating device-temperature dependence of the small-signal a parameter.

On the other hand, device-temperature dependence of a characteristic of a direct current extinction ratio (DCER) and small-signal α parameter (alpha parameter: chirping parameter) is now described on the EA modulator. Here, FIG. 4 is a view for illustrating device-temperature dependence of the characteristic of the direct current extinction ratio (DCER). FIG. 5 is a view for illustrating device-temperature dependence of the small-signal α parameter. In FIGS. 4 and 5, horizontal axes show reverse-direction voltage applied to the EA modulator section. As the device temperature is increased, since the detuning level ΔH is decreased and absorption in the EA modulator section is increased, the DCER is decreased. Similarly, as the device temperature is increased, since the detuning level ΔH is decreased and absorption in the EA modulator section is increased, the small-signal α parameter is reduced.

When the device temperature is varied to be adapted to the wavelength channel for DWDM, approximately the same modulation and transmission characteristics need to be given in a range of varied temperature. First, to obtain approximately the same optical output during modulation, operational current of the DFB-LD must be varied. Specifically, in consideration that optical output of the DFB-LD itself is decreased with increase in temperature, and a fundamental absorption level (absorption level in a condition that the reverse-direction voltage applied to the EA modulator is zero) is increased with decrease in detuning level ΔH, as shown by black dots in respective curves of FIG. 3, operational current needs to be varied from Iop1 to Iop4. That is, the figure shows that optical output of the DFB-LD is necessary to be larger with increase in temperature.

Figure 6:
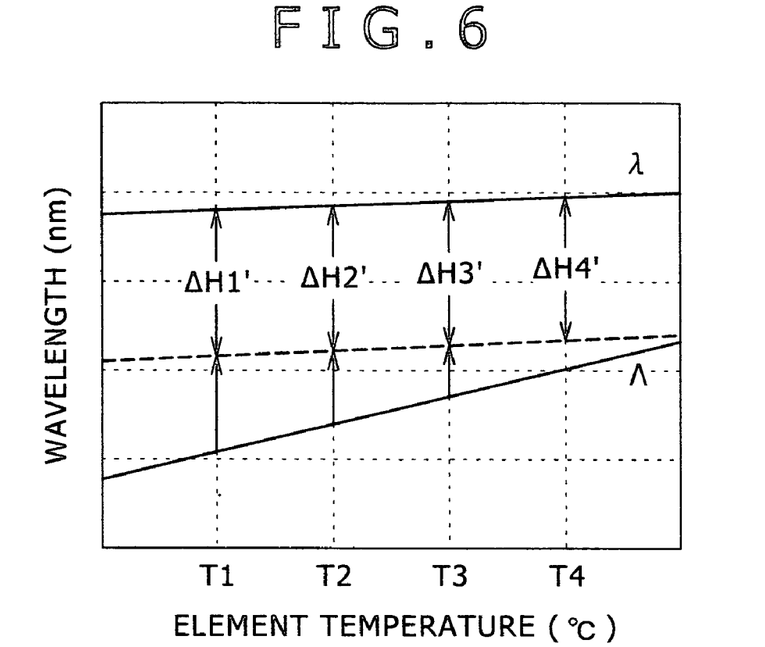
FIG. 6 is a view for illustrating operation that reverse-direction voltage applied to the EA modulator is changed such that a detuning level ΔH is corrected to be seemingly constant at each temperature.

In the EA modulator section, to reduce temperature dependence of the detuning level ΔH, the reverse-direction applied voltage is changed depending on temperature. That is, the section uses a phenomenon that according to the quantum confinement Stark effect, when the reverse-direction voltage is applied to the EA modulator, an absorption spectrum of the EA modulator section is shifted to a long wavelength side, and the detuning level ΔH is seemingly reduced. FIG. 6 is a view for illustrating that the reverse-direction voltage applied to the EA modulator is changed such that the detuning level ΔH is corrected to be seemingly constant at each temperature. FIG. 6 collectively shows the characteristics in FIG. 3, wherein the reverse-direction applied-voltage is increased with decrease in temperature, thereby temperature dependence of the detuning level ΔH is reduced. In this way, ΔH is essentially corrected to be approximately constant to obtain similar modulation and transmission characteristics of the EA modulator at each temperature.

Furthermore, since a saturated extinction ratio in the direct current extinction ratio is reduced with decrease in temperature as shown in FIG. 4, amplitude of high frequency voltage to be operated needs to be increased with decrease in temperature on order to obtain an approximately constant alternating current extinction ratio (ACER) at each temperature. In FIG. 4, large reverse-direction voltage Vb1 and large amplitude voltage Vpp1 are necessary at a low temperature (T1) to obtain a certain ACER. On the other hand, small reverse-direction voltage Vb4 and small amplitude voltage Vpp4 are enough at a high temperature (T4).

On the other hand, regarding the small signal α parameter, as shown in FIG. 5, α curves in the same level can be cut out when the reverse-direction voltage and the amplitude voltage are given at the same temperature. That is, an α value at the reverse-direction voltage Vb1 at the low temperature (T1) is approximately the same as an α value at the reverse-direction voltage Vb4 at the high temperature (T4). Moreover, an α value at a voltage as the sum of the reverse-direction voltage Vb1 and amplitude voltage Vpp1 at the low temperature (T1) is approximately the same as an α value at a voltage as the sum of the reverse-direction voltage Vb4 and amplitude voltage Vpp4 at the high temperature (T4). Therefore, transmission in a desired distance can be performed at any temperature.

Figure 7:
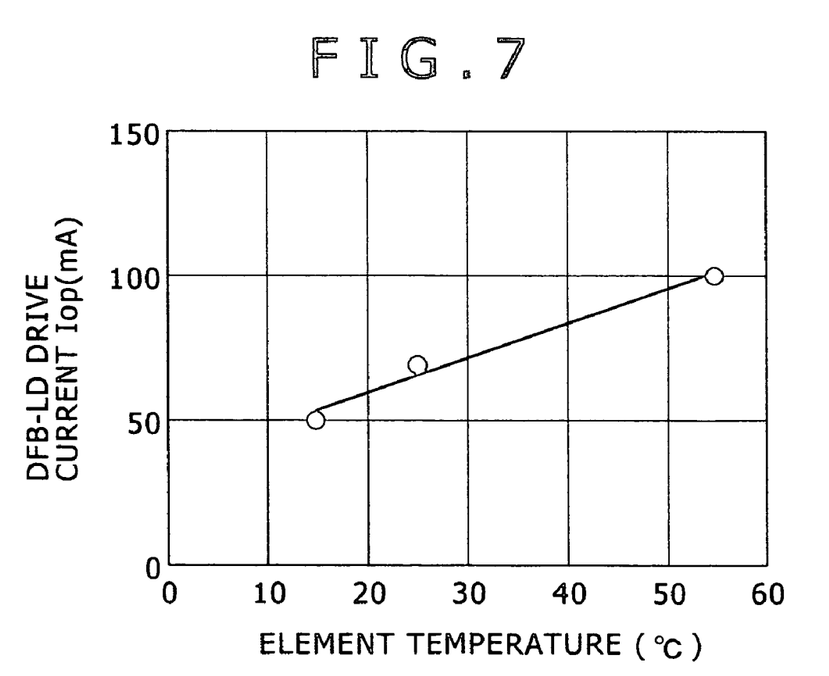
FIG. 7 is a view for illustrating a result of obtaining driving current Iop of the DFB-LD to satisfy approximately the same modulation and transmission characteristics at each temperature.
Figure 8:
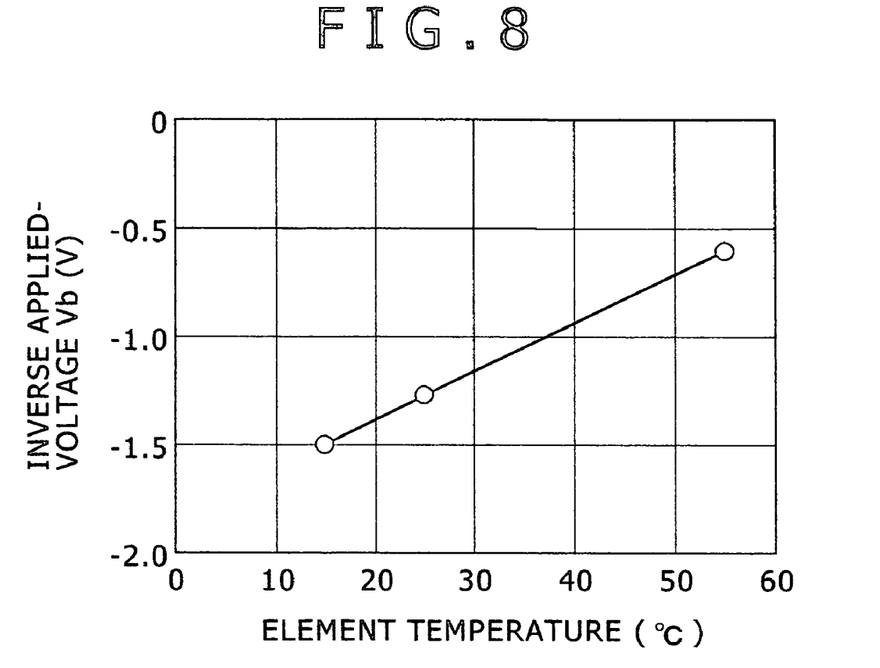
FIG. 8 is a view for illustrating a result of obtaining reverse voltage Vb applied to the EA modulator to satisfy approximately the same modulation and transmission characteristics at each temperature.
Figure 9:
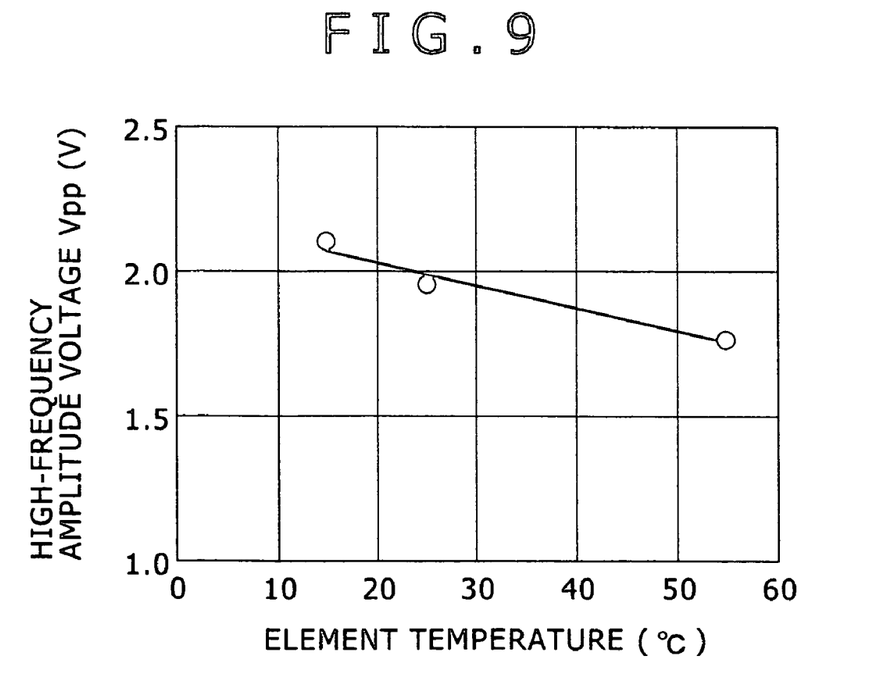
FIG. 9 is a view for illustrating a result of obtaining voltage amplitude Vpp of a high-frequency signal to satisfy approximately the same modulation and transmission characteristics at each temperature.

Hereinafter, in the EA/DFB device using the indium-gallium-arsenic-phosphorous (InGaAsP) base MQW for the active layer of the EA modulator section, results of operation that the device is driven at the transmission rate of 10 Gbits/sec, and transmission in a distance of 40 km is performed are described. At that time, the device is operated at the device temperature of 15° C. to 55° C., that is, in a wavelength range of about 4 nm. FIG. 7 is a view for illustrating a result of obtaining driving current Iop of the DFB-LD to satisfy approximately the same modulation and transmission characteristics at each temperature. FIG. 8 is a view for illustrating a result of obtaining reverse voltage Vb applied to the EA modulator to satisfy approximately the same modulation and transmission characteristics at each temperature. FIG. 9 is a view for illustrating a result of obtaining voltage amplitude Vpp of a high-frequency signal to satisfy approximately the same modulation and transmission characteristics at each temperature. Each of figures shows an approximately linear characteristic in a temperature range of 15° C. to 55° C. Therefore, if these characteristics are recorded in the EA modulator control circuit 115 and the laser driver current control circuit 116 in FIG. 1, and thus the EA modulator drive 111 and the laser drive current driver 112 are controlled, approximately the same modulation and transmission characteristics can be obtained in the temperature range of 15° C. to 55° C.

Figure 10:
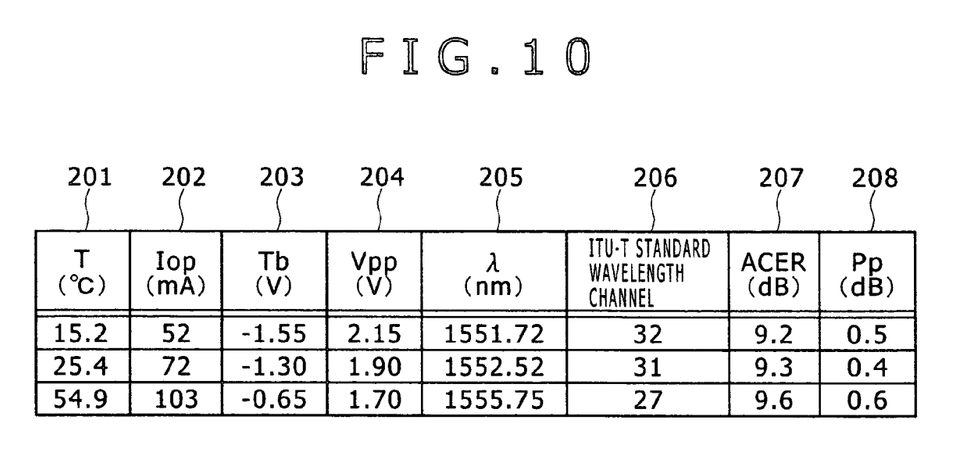
FIG. 10 is a view for illustrating an oscillation wavelength, driving conditions, the modulation characteristic, and the transmission characteristic at each temperature.

FIG. 10 collectively shows optimum drive conditions obtained by measurement and results of modulation/transmission characteristics when the wavelength tunable optical transmitter is driven at the transmission rate of 10 Gbits/sec, and transmission in 40 km is performed. The characteristics are optimum characteristics that can be obtained by finely adjusting rough drive conditions examined over a wide temperature range in a state of the device. Here, FIG. 10 is a view for illustrating the oscillation wavelength, driving conditions, modulation characteristic, and transmission characteristic at each temperature. In FIG. 10, T 201 is the temperature of the EA/DFB device, Iop 202 is drive current of the DFB-LD at the device temperature, Vb 203 is reverse-direction applied-voltage of the EA modulator, Vpp 204 is high-frequency amplitude voltage of the EA modulator, λ 205 is an oscillation wavelength at the device temperature, ITU-T standard wavelength channel 206 is a corresponding channel number, ACER 207 is an alternating current extinction ratio of the modulation characteristic, and Pp 208 is path penalty of the transmission characteristic. As shown in FIG. 10, characteristics satisfying the ITU-T standard can be obtained in 6 wavelength channels.

While the drive conditions are determined assuming that the laser section of the semiconductor photonic device mounted on the wavelength tunable laser module is the DFB-LD in the example, it will be appreciated by those skilled in the art that since temperature dependence of the oscillation wavelength is the same even in the case of the DBR-LD as that in the DFB-LD, when it is mounted in the wavelength tunable laser module, drive conditions can be determined in the same way. This is the same in the other examples.

The semiconductor laser used in the example is a semiconductor laser that oscillates in a single longitudinal mode having a sub-mode suppression ratio of 30 dB or more (more preferably 35 dB or more). Furthermore, a temperature control range may be narrowed into 20° C. to 50° C. so that width of the tunable wavelength range is 3 nm to achieve a further stable characteristic.

Example 2

Figure 11A:
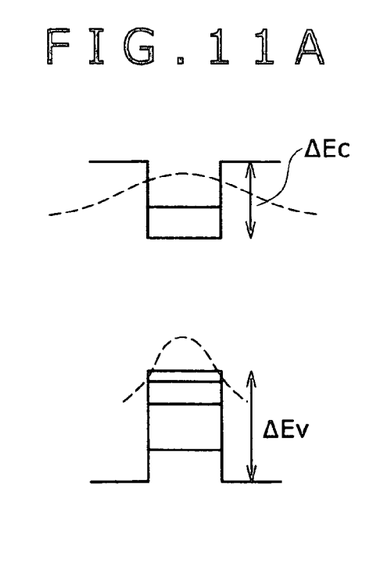
FIGS. 11A and 11B are views for illustrating band structures of InGaAsP base MQW and InGaAlAs base MQW.
Figure 11B:
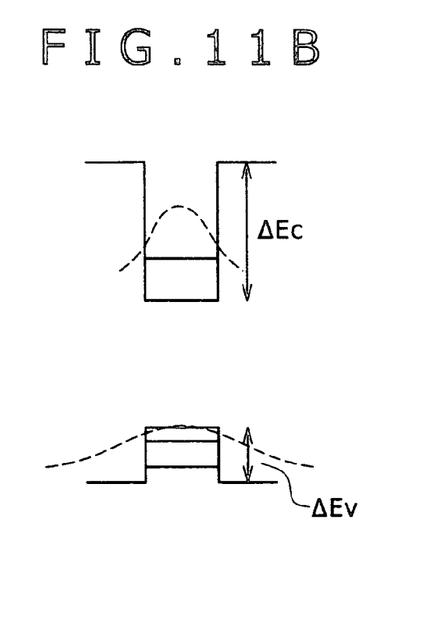

FIGS. 11A to 11B are views for illustrating band structures of InGaAsP base MQW and InGaAlAs base MQW. The InGaAsP base MQW shown in FIG. 11A has a feature that band offset ΔEv in a valence band is large, and band offset ΔEc in a conduction band is small. The InGaAlAs base MQW shown in FIG. 11B has a feature that ΔEv is small, and ΔEc is large. In an EA modulator including the InGaAsP base MQW, while electrons can be sufficiently confined when a well is deep, when the modulator employs a structure that holes are weakly confined aiming to improving the chirping characteristic, or reducing the small-signal α parameter, electrons having light effective mass are insufficiently confined at the same time, consequently the extinction ratio that is an on-off ratio of light is reduced. On the other hand, in an EA modulator including the InGaAlAs base MQW, as known from comparison of FIGS. 11A to 11B, even if holes are weakly confined to improve the chirping characteristic, electrons can be confined sufficiently strongly, consequently a large extinction ratio can be obtained.

When the device temperature is further decreased, since the saturated extinction ratio of the direct current extinction ratio is generally reduced, the alternating current extinction ratio tends to be reduced. However, in the InGaAlAs base MQW, the sufficient alternating current extinction ratio can be obtained even at a low temperature due to the feature of the band structure described above. Moreover, in the case of the DFB-LD including the InGaAlAs base MQW, since electrons are strongly confined compared with the DFB-LD including the InGaAsP base MQW, and holes are uniformly injected, electrons hardly leak from the MQW even at a high temperature and thus stable operation can be performed over a wide temperature range. However, even if light power is finally absorbed in the EA modulator to some degree, if required optical output power can be obtained in a wide temperature range, the semiconductor material used for the active layer of the DFB-LD can be either InGaAsP base MQW or InGaAlAs base MQW. In this way, use of the InGaAlAs base MQW for the active layer is extremely effective method for improving the characteristics. The EA/DFB device including the InGaAlAs base MQW is different from the EA/DFB device including the InGaAsP base MQW only in that the used semiconductor material is different. Therefore, the EA/DFB device including the InGaAlAs base MQW can be fabricated without reducing yield only by somewhat modifying a manufacturing process such as a preprocessing method of an etchant or crystal growth.

Figure 12:
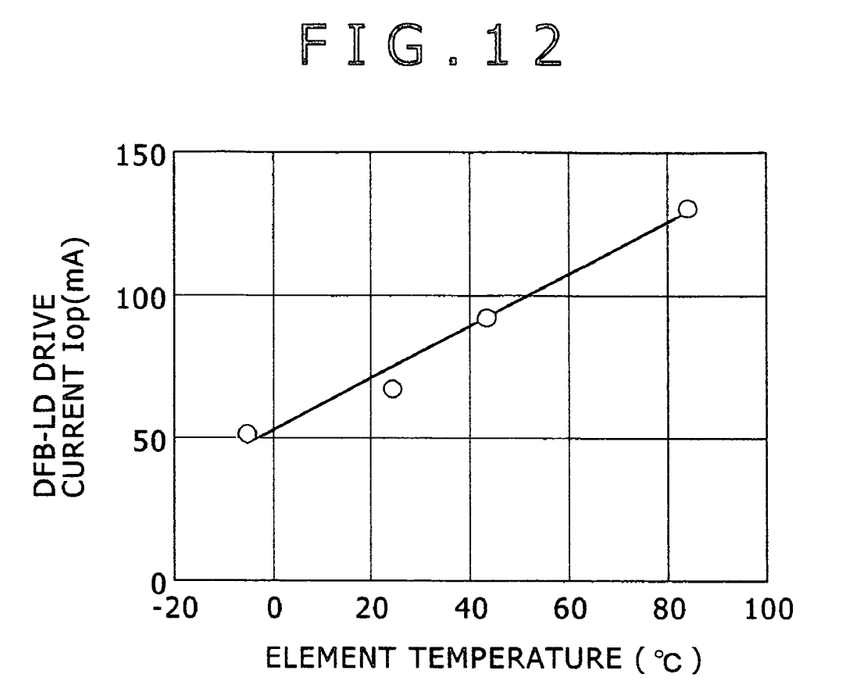
FIG. 12 is a view for illustrating a result of obtaining the driving current Iop of the DFB-LD to satisfy approximately the same modulation and transmission characteristics at each temperature.
Figure 13:
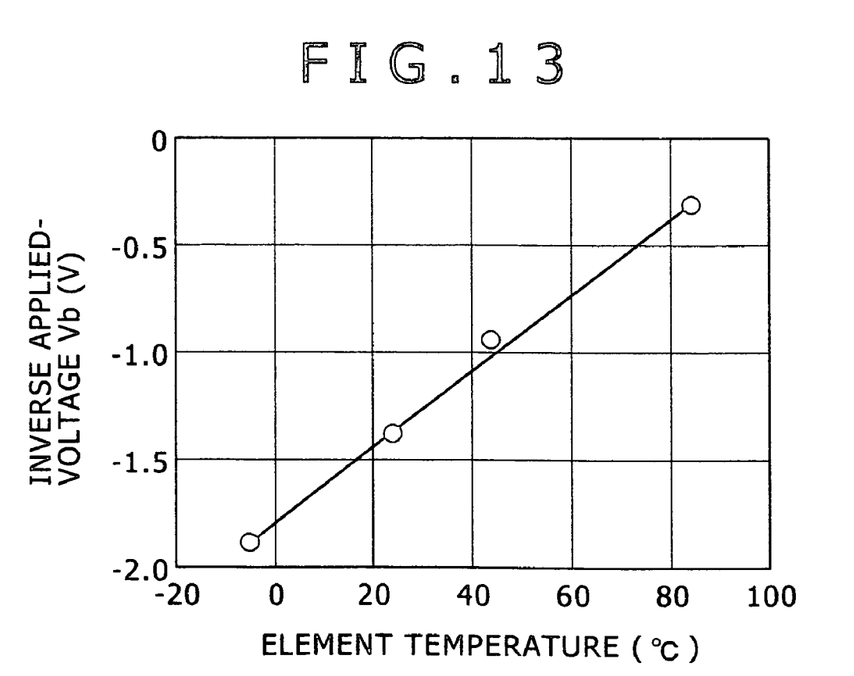
FIG. 13 is a view for illustrating a result of obtaining the reverse voltage Vb applied to the EA modulator to satisfy approximately the same modulation and transmission characteristics at each temperature.
Figure 14:
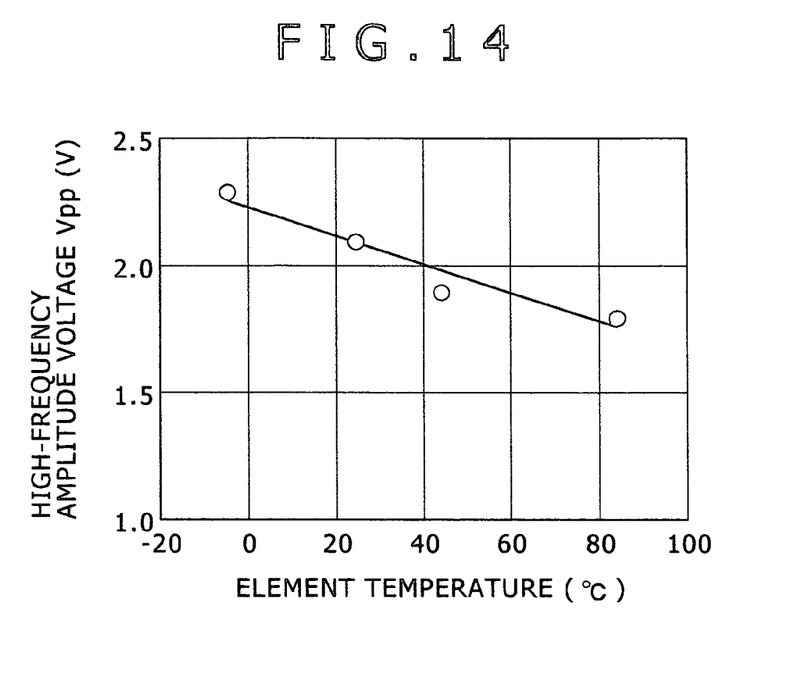
FIG. 14 is a view for illustrating a result of obtaining the voltage amplitude Vpp of the high-frequency signal to satisfy approximately the same modulation and transmission characteristics at each temperature.

Hereinafter, in an optical transmitter mounted with the EA/DFB device using the InGaAlAs base MQW for the active layer of the EA modulator section, results of operation that the device is driven at the transmission rate of 10 Gbits/sec, and transmission in a distance of 80 km is performed are described. At that time, the device is operated at the device temperature of −5° C. to 85° C., that is, in a wavelength range of about 9 nm. Here, FIG. 12 is a view for illustrating a result of obtaining the driving current Iop of the DFB-LD to satisfy approximately the same modulation and transmission characteristics at each temperature. FIG. 13 is a view for illustrating a result of obtaining the reverse voltage Vb applied to the EA modulator to satisfy approximately the same modulation and transmission characteristics at each temperature. FIG. 14 is a view for illustrating a result of obtaining the voltage amplitude Vpp of the high frequency signal to satisfy approximately the same modulation and transmission characteristics at each temperature. Each of figures shows an approximately linear characteristic in the temperature range of −5° C. to 85° C. Therefore, if these characteristics are recorded in the EA modulation control circuit 115 and the laser drive current control circuit 116, and thus the EA modulator driver 111 and the laser drive current driver 112 are controlled, approximately the same modulation and transmission characteristics can be obtained in the temperature range of −5° C. to 85° C.

Figure 15:
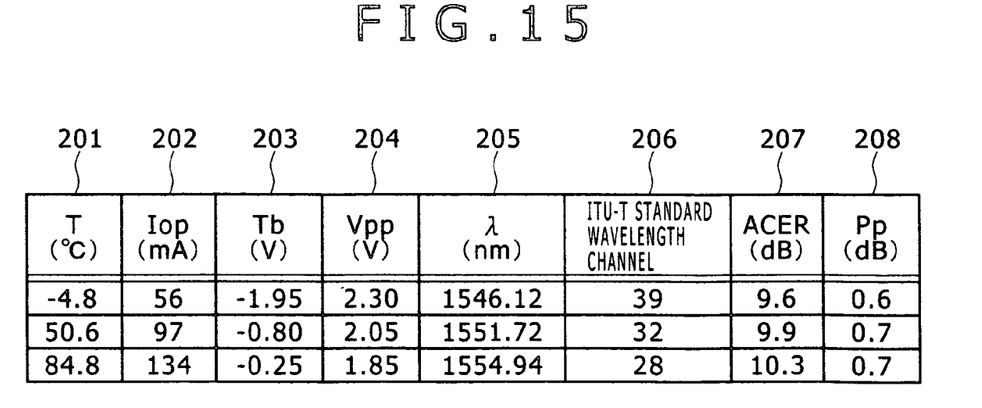
FIG. 15 is a view for illustrating the oscillation wavelength, driving conditions, modulation characteristic, and transmission characteristic at each temperature.

FIG. 15 collectively shows optimum drive conditions and results of modulation/transmission characteristics when the wavelength tunable optical transmitter is driven at the transmission rate of 10 Gbits/sec, and transmission in 80 km is performed. Here, FIG. 15 is a view for illustrating the oscillation wavelength, driving conditions, modulation characteristic, and transmission characteristic at each temperature. While each column of FIG. 15 can be described in the same way as in FIG. 10, since the EA/DFB device using the InGaAlAs base MQW is mounted, a usable temperature range is wide, consequently an optical transmitter in which the wavelength is tunable in a range of 12 wavelength channels can be obtained. As shown in FIG. 15, characteristics satisfying the ITU-T standard can be obtained in 12 wavelength channels.

Example 3

Figure 16:
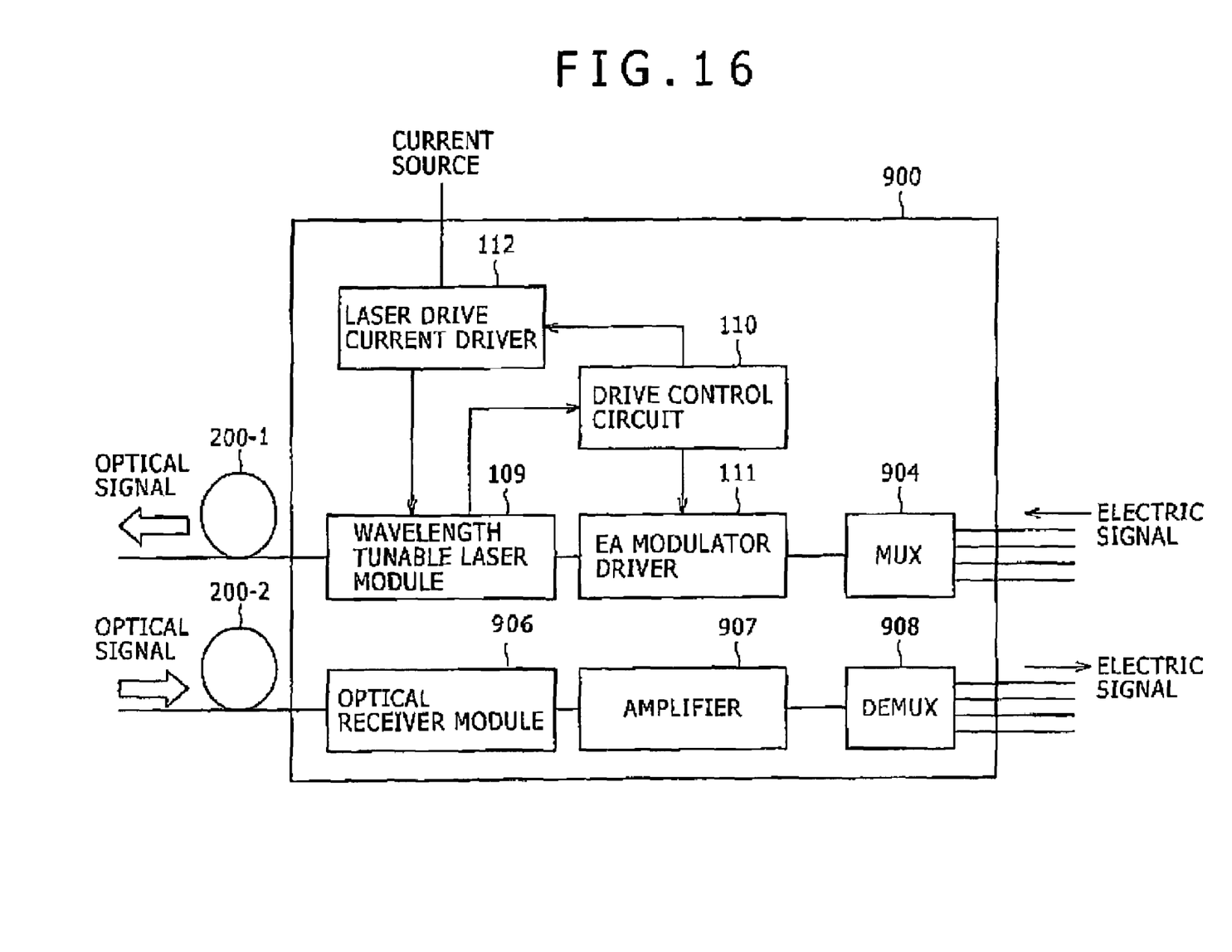
FIG. 16 is a block diagram of an optical transceiver.

An optical transceiver as another embodiment is described with reference to FIG. 16. Here, FIG. 16 is a block diagram of the optical transceiver. In FIG. 16, multiple electric signals in a low bit rate are converted into electric signals in the transmission rate of 10 Gbits/sec by MUX (multiplexer) 904, and then inputted into the EA modulator driver 111. The wavelength tunable laser module 109 determines an oscillation wavelength by a not-shown control line, and controls the temperature to obtain the oscillation wavelength. That controlled temperature is transmitted to the drive control circuit 110 which obtains drive current of the LD, and reverse-direction voltage and high-frequency amplitude voltage of the EA modulator by referring a not-shown reference table provided in the drive control circuit 110. The drive control circuit 110 set the drive conditions in the EA modulator driver 111 and the laser drive current driver 112 respectively. The EA modulator driver 111 and the laser drive current driver 112 drive the EA modulator section and the DFB-LD section of the wavelength tunable laser module 109 respectively. As a result, an optical signal at the transmission rate of 10 Gbits/sec, in which approximately the same modulation and transmission characteristics are secured, can be sent out to a fiber 200-1 in any of tunable wavelength channels.

On the other hand, an optical signal at the transmission rate of 10 Gbits/sec from a fiber 200-2 is subjected to OE conversion in an optical receiver module 906 and amplified by an amplifier 907, and then branched into multiple electric signals in a low bit rate by DEMUX (branching filter) 908.

In the example, the wavelength tunable optical transmitter, in which the drive conditions of the DFB-LD and the EA modulator are determined in each of the wavelength channels described in the examples 1 and 2, is incorporated in the optical transceiver. Thus, a small and inexpensive optical transceiver can be realized, in which transmission in a 40 km or 80 km at the transmission rate of 10 Gbits/sec can be achieved, and the wavelength is tunable in 6 or 12 channels with a wavelength interval of 0.8 nm.

In this specification, the optical transmitter includes the optical transceiver.

According to the embodiments of the invention, a wavelength tunable optical transmitter, having small device size and a constant output characteristic independently of a wavelength, can be obtained.

We claim:

1. A wavelength tunable optical transmitter, comprising:
   a single electroabsorption modulator integrated laser having an electroabsorption modulator and a semiconductor laser integrated on a substrate;
   a temperature control section for controlling a temperature of the electroabsorption modulator integrated laser and continuously outputting a device temperature corresponding to the temperature of the electroabsorption modulator integrated laser;
   a laser drive section for driving the semiconductor laser based on the device temperature output by the temperature control section, and for storing data of driving currents for an arbitrary temperature; and
   a modulator drive section for driving the electroabsorption modulator based on the device temperature output by the temperature control section, and for storing data of reverse voltages and voltage amplitudes for the arbitrary temperature,
   wherein said temperature control section changes the temperature of the electroabsorption modulator integrated laser so that an oscillation wavelength of the semiconductor laser is made tunable within a wavelength range of 3 nm or more; and
   wherein said laser drive section and said modulator drive section drive a driving current of the semiconductor laser and reverse voltage and amplitude voltage of the electroabsorption modulator continuously and respectively such that the electroabsorption modulator integrated laser has approximately the same optical output, modulation and transmission characteristics in the predetermined wavelength range.

2. A wavelength tunable optical transmitter, comprising:
   a single electroabsorption modulator integrated laser having an electroabsorption modulator and a semiconductor laser integrated on a substrate;
   a temperature control section for controlling temperature of the electroabsorption modulator integrated laser and continuously outputting a device temperature corresponding to the temperature of the electroabsorption modulator integrated laser;
   a laser drive section for driving the semiconductor laser based on the device temperature output by the temperature control section, and for storing data of driving currents for an arbitrary temperature; and
   a modulator drive section for driving the electroabsorption modulator based on the device temperature output by the temperature control section, and for storing data of reverse voltages and voltage amplitudes for the arbitrary temperature,
   wherein said laser drive section changes a current applied to the semiconductor laser depending on temperature within a temperature range of difference in temperature of 30° C. or more provided by the temperature control section, and
   wherein said modulator drive section changes amplitude voltage of a high frequency signal applied to the electroabsorption modulator and reverse voltage applied to the electroabsorption modulator depending on temperature within the temperature range.

3. The wavelength tunable optical transmitter according to claim 1,
wherein said electroabsorption modulator comprises a multiple quantum well with indium-gallium-aluminum-arsenic as a material.

4. The wavelength tunable optical transmitter according to claim 2,
wherein said electroabsorption modulator comprises a multiple quantum well with indium-gallium-aluminum-arsenic as a material.

5. The wavelength tunable optical transmitter according to claim 1,
wherein said electroabsorption modulator comprises a multiple quantum well with indium-gallium-arsenic-phosphorous as a material.

6. The wavelength tunable optical transmitter according to claim 2,
wherein said electroabsorption modulator comprises a multiple quantum well with indium-gallium-arsenic-phosphorous as a material.

7. The wavelength tunable optical transmitter according to claim 1,
wherein said semiconductor laser is a distributed feedback laser diode or a distributed Bragg reflector laser diode.

8. The wavelength tunable optical transmitter according to claim 2,
wherein said semiconductor laser is a distributed feedback laser diode or a distributed Bragg reflector laser diode.

9. The wavelength tunable optical transmitter according to claim 1,
wherein said electroabsorption modulator integrated laser is operated at a transmission rate of 2.5 Gbits/sec or more.

10. The wavelength tunable optical transmitter according to claim 2,
wherein said electroabsorption modulator integrated laser is operated at a transmission rate of 2.5 Gbits/sec or more.

11. An optical transceiver comprising:
a wavelength tunable optical transmitter including:
a wavelength tunable laser module mounted with a single electroabsorption modulator integrated laser having an electroabsorption modulator and a semiconductor laser integrated on a semiconductor substrate, and a temperature control section for controlling a temperature of the electroabsorption modulator integrated laser and continuously outputting a device temperature corresponding to the temperature of the electroabsorption modulator integrated laser,
a laser drive section for driving the semiconductor laser based on the device temperature output by the temperature control section, and for storing data of driving currents for an arbitrary temperature, and
a modulator drive section for driving the electroabsorption modulator based on the device temperature output by the temperature control section, and for storing data of reverse voltages and voltage amplitudes for the arbitrary temperature; and
an optical receiver including an optical receiver module for converting a received optical signal into an electric signal,
wherein said temperature control section changes the temperature of the electroabsorption modulator integrated laser so that an oscillation wavelength of the semiconductor laser is made tunable within a wavelength range of 3 nm or more; and
wherein said laser drive section and said modulator drive section drive a driving current of the semiconductor laser and reverse voltage and amplitude voltage of the electroabsorption modulator continuously and respectively such that the electroabsorption modulator integrated laser has approximately the same optical output, modulation and transmission characteristics in the predetermined wavelength range.

12. An optical transceiver comprising:
a wavelength tunable optical transmitter including:
a wavelength tunable laser module mounted with a single electroabsorption modulator integrated laser having an electroabsorption modulator and a semiconductor laser integrated on a semiconductor substrate, and a temperature control section for controlling a temperature of the electroabsorption modulator integrated laser and continuously outputting a device temperature corresponding to the temperature of the electroabsorption modulator integrated laser,
a laser drive section for driving the semiconductor laser based on the device temperature output by the temperature control section, and for storing data of driving currents for an arbitrary temperature, and
a modulator drive section for driving the electroabsorption modulator based on the device temperature output by the temperature control section, and for storing data of reverse voltages and voltage amplitudes for the arbitrary temperature; and
an optical receiver including an optical receiver module for converting a received optical signal into an electric signal,
wherein said laser drive section changes a current applied to the semiconductor laser depending on temperature within a temperature range of difference in temperature of 30° C. or more provided by the temperature control section; and
wherein said modulator drive section changes amplitude voltage of a high frequency signal applied to the electroabsorption modulator and reverse voltage applied to the electroabsorption modulator depending on a temperature within the temperature range.

* * * * *

UNITED STATES PATENT AND TRADEMARK OFFICE
CERTIFICATE OF CORRECTION

PATENT NO. : 7,733,929 B2
APPLICATION NO. : 11/452312
DATED : June 8, 2010
INVENTOR(S) : Sasada et al.

It is certified that error appears in the above-identified patent and that said Letters Patent is hereby corrected as shown below:

Title Page, Item (75) Inventors, please amend as follows:

Noriko Sasada, Yokohama (JP);
Kazuhiko Naoe, Yokohama (JP);
Kazuhisa Uomi, Hachioji (JP);
Masanobu Okayasu, Yokohama (JP)

Signed and Sealed this
First Day of February, 2011

David J. Kappos
*Director of the United States Patent and Trademark Office*